(12) United States Patent
Wrona et al.

(10) Patent No.: US 10,172,265 B2
(45) Date of Patent: Jan. 1, 2019

(54) BOARD LEVEL SHIELD INCLUDING AN INTEGRATED HEAT SINK

(71) Applicant: Laird Technologies, Inc., Earth City, MO (US)

(72) Inventors: Timothy M. Wrona, Schaumburg, IL (US); Gerald R. English, Glen Ellyn, IL (US); Daniel Jacklinski, Schaumburg, IL (US)

(73) Assignee: LAIRD TECHNOLOGIES, INC., Chesterfield, MI (US)

( * ) Notice: Subject to any disclaimer, the term of this patent is extended or adjusted under 35 U.S.C. 154(b) by 0 days.

(21) Appl. No.: 15/947,120

(22) Filed: Apr. 6, 2018

(65) Prior Publication Data

US 2018/0228065 A1    Aug. 9, 2018

Related U.S. Application Data

(63) Continuation of application No. PCT/US2016/059263, filed on Oct. 28, 2016.
(Continued)

(51) Int. Cl.
*H05K 7/00* (2006.01)
*H05K 9/00* (2006.01)
(Continued)

(52) U.S. Cl.
CPC ........... *H05K 9/0081* (2013.01); *H01L 23/34* (2013.01); *H05K 7/2039* (2013.01);
(Continued)

(58) Field of Classification Search
CPC ............ H05K 7/2039; H05K 7/20918; H05K 7/20945; H05K 9/0081; H05K 9/0032; H01L 23/34
(Continued)

(56) References Cited

U.S. PATENT DOCUMENTS 6,166,918 A * 12/2000 Olofsson .............. H05K 9/0032
174/361
7,488,902 B2    2/2009 English et al.
(Continued)

FOREIGN PATENT DOCUMENTS

WO    WO-2016077683 A1    5/2016

OTHER PUBLICATIONS

PCT International Search Report and Written Opinion for PCT Application No. PCT/US2016/059263 (now WO2017/087136) which is the parent application to the instant application, dated Jan. 20, 2017, 14 pages.
(Continued)

*Primary Examiner* — Hung S. Bui
(74) *Attorney, Agent, or Firm* — Harness, Dickey & Pierce, P.L.C.; Anthony G. Fussner

(57) ABSTRACT

A shielding assembly is disclosed, the assembly including at least a board level shield and a heat sink. The assembly may include a board level shield that includes both a lid and a fence, and may also include a thermal interface material, where the assembly may be mounted on a printed circuit board to provide both EMI shielding and thermal management of heat-generating electronic components or heat sources on the circuit board. The heat sink includes at least one pin, and the shield includes at least one complementary perforation relative to the pin, such that an assembled device of the disclosure provides both EMI shielding and thermal management while permitting the transfer of thermal energy via the heat sink pin through the board level shield perforation.

20 Claims, 11 Drawing Sheets

Related U.S. Application Data

(60) Provisional application No. 62/258,141, filed on Nov. 20, 2015.

(51) Int. Cl.
*H01L 23/34* (2006.01)
*H05K 7/20* (2006.01)

(52) U.S. Cl.
CPC ..... *H05K 7/20918* (2013.01); *H05K 7/20945* (2013.01); *H05K 9/0032* (2013.01)

(58) Field of Classification Search
USPC .......................................... 361/816, 818, 729
See application file for complete search history.

(56) References Cited

U.S. PATENT DOCUMENTS

| | | | |
|---|---|---|---|
| 7,491,889 B2 | 2/2009 | Dinkelmeyer et al. | |
| 7,504,592 B1 | 3/2009 | Crotty, Jr. | |
| 7,623,360 B2 | 11/2009 | English et al. | |
| 8,059,416 B2* | 11/2011 | Li | H05K 9/0032 |
| | | | 361/752 |
| 8,213,180 B2 | 7/2012 | Zhao et al. | |
| 9,439,333 B2* | 9/2016 | Daughtry, Jr. | H05K 9/0028 |
| 9,462,832 B2 | 10/2016 | Lord | |
| 10,015,907 B2* | 7/2018 | Wu | H05K 7/20254 |
| 2002/0084060 A1* | 7/2002 | Sasaki | H01L 23/3672 |
| | | | 165/80.3 |
| 2003/0035270 A1 | 2/2003 | Shieh et al. | |
| 2004/0027816 A1 | 2/2004 | Ice | |
| 2004/0190260 A1* | 9/2004 | Sasaki | F28F 3/02 |
| | | | 361/704 |
| 2007/0086170 A1 | 4/2007 | Liang | |
| 2007/0210082 A1 | 9/2007 | English et al. | |
| 2010/0061066 A1 | 3/2010 | Guan et al. | |
| 2013/0210269 A1* | 8/2013 | Neer | G02B 6/4246 |
| | | | 439/487 |
| 2014/0247564 A1 | 9/2014 | Shi et al. | |
| 2015/0327394 A1 | 11/2015 | Davis et al. | |

OTHER PUBLICATIONS

Packaging and Storage Considerations, Thermal Interface—Wet Dispensed; http:www.dowcorning.com/content/etronics/etronicswet/newtim_tutorial_14.asp?DCWS . . . May 17, 2016, 1 page.

Basics of Processing for Fabricated films and Pads—Dow Corning; Thermal Interface—Wet Dispensed, http://www.dowcorning.com/content/etronics/etronicswet/newtim_tutorial_13.asp?DCWS . . . May 17, 2016, 1 page.

Types of Fabricated Films and Pad Thermal Interface Materials—Dow Corning, Thermal Interface—Wet Dispensed, http://www.dowcorning.com/content/etronics/etronicswet/newtim_tutorial5.asp May 17, 2016, 1 page.

European Search Report for European application No. 16866833.3 which claims priority to the same parent application as the instant application, dated Nov. 2, 2018, 4 pages.

\* cited by examiner

BOARD LEVEL SHIELD INCLUDING AN INTEGRATED HEAT SINK

CROSS-REFERENCE TO RELATED APPLICATIONS

This application is a U.S. continuation application that claims priority to and the benefit of PCT International Application No. PCT/US2016/059263 filed Oct. 28, 2016 (published as WO 2017/087136 on May 26, 2017), which, in turn, claims priority to U.S. Provisional Patent Application No. 62/258,141 filed Nov. 20, 2015. The entire disclosures of the above applications are incorporated herein by reference.

FIELD

The present disclosure generally relates to board level shields including integrated heat sinks.

BACKGROUND

This section provides background information related to the present disclosure which is not necessarily prior art.

Electromagnetic interference (EMI) shielding is an important aspect of electronic device manufacture and function. EMI may cause undesirable performance or failure of electronic components in an electronic device. EMI shielding may be achieved in a variety of manners, including through the use of a metallic board level shield (BLS). Such shields may be solderable to printed circuit boards (PCBs), and some are two-piece shields that include solderable walls and a lid that is attachable thereto. A BLS may thusly enclose electrical components on the PCB and provide EMI mitigation or elimination. In certain applications, it may be desirable to have additional materials on the underside of the BLS, including the underside of the BLS lid when a two-piece shield is used.

Electronic components, including those mounted on a PCB, may generate heat, this heat potentially causing undesirable performance of the component and/or surrounding components. Removing heat from electronic components is thus an important aspect of electronic device manufacture and function. Heat sinks are passive heat exchangers that transfer heat generated by a device, such as an electronic device, for example an integrated circuit, away from the device. Heat sinks may dissipate the heat in a variety of ways, including via contact with ambient air or forced air, or to a liquid coolant, or to any material capable of thermal transfer. Heat sinks may make direct contact with the heat-generating device or contact the device via an intermediary substance, such as a thermal grease, paste, or pad.

SUMMARY

This section provides a general summary of the disclosure, and is not a comprehensive disclosure of its full scope or all of its features.

A new board level shield is disclosed, the BLS being integrated with a heat sink (broadly, a heat removal/dissipation structure), where the heat sink makes contact, either directly or via an intermediary substance, with at least one heat-generating electronic component (broadly, a heat source). The BLS includes at least one opening through which a portion of the heat sink may protrude, thereby permitting the transfer of heat (via the heat sink) from the heat-generating component, while still providing EMI protection for the heat-generating component. The BLS may be a single piece, or may include a fence or frame, and a lid or cover that has been configured to permit a portion of the heat sink to pass through it from beneath the lid.

The underside of the heat sink may include a thermal interface material, such as a thermal grease, paste, or pad, to aid in the thermal contact between the bottom of the heat sink and the one or more heat-generating electronic devices thereunder.

The BLS may be solderable to a PCB. Where the BLS is a two piece BLS, the lid and fence may include some locking or other retention mechanism to keep the lid and fence conjoined until the lid is removed by a user. Such a retention mechanism could be, for example, a directional latching feature that allows a thermal interface material to be compressed between the underside of the BLS and the heat-generating electronic component(s), thereby providing an improved thermal performance as compared to an uncompressed thermal interface material. Where a compression/latching feature is also present, it may be desirable to have tabs on the cover that prevent over-compression.

The lid of a two piece BLS might include a variety of or series of similar apertures to allow portions of the heat sink to protrude through the BLS. These apertures may be a series of holes arranged in a lattice, by way of non-limiting example. One or more holes might include retention mechanisms to permit a snug fit against any protrusions from the BLS, which may be complementary in shape to any apertures on the lid of the BLS.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

An assembly for board level shielding and thermal management is disclosed. The assembly includes a board level shield and a heat sink (broadly, a heat removal/dissipation structure). The board level shield includes one or more perforations (broadly, openings). The heat sink includes one or more pins (broadly, protrusions or protruding portions). The pins and the perforations are complementary in shape such that the board level shield may cover the heat sink and the pins pass through the board level shield via the perforations.

The board level shield of the disclosure may be a single piece BLS, or may be a multi-piece BLS. Where a multi-piece BLS is present, the BLS may include a fence and a lid. A fence may be a perimeter of material, and the lid may be a cover that mounts atop the fence. In an exemplary embodiment, the BLS is manufactured from a metal or metal alloy, including via stamping a sheet of metal or metal alloy and bending the BLS into the desired shape (or shapes, where a multi-piece BLS is present).

Figure 1:
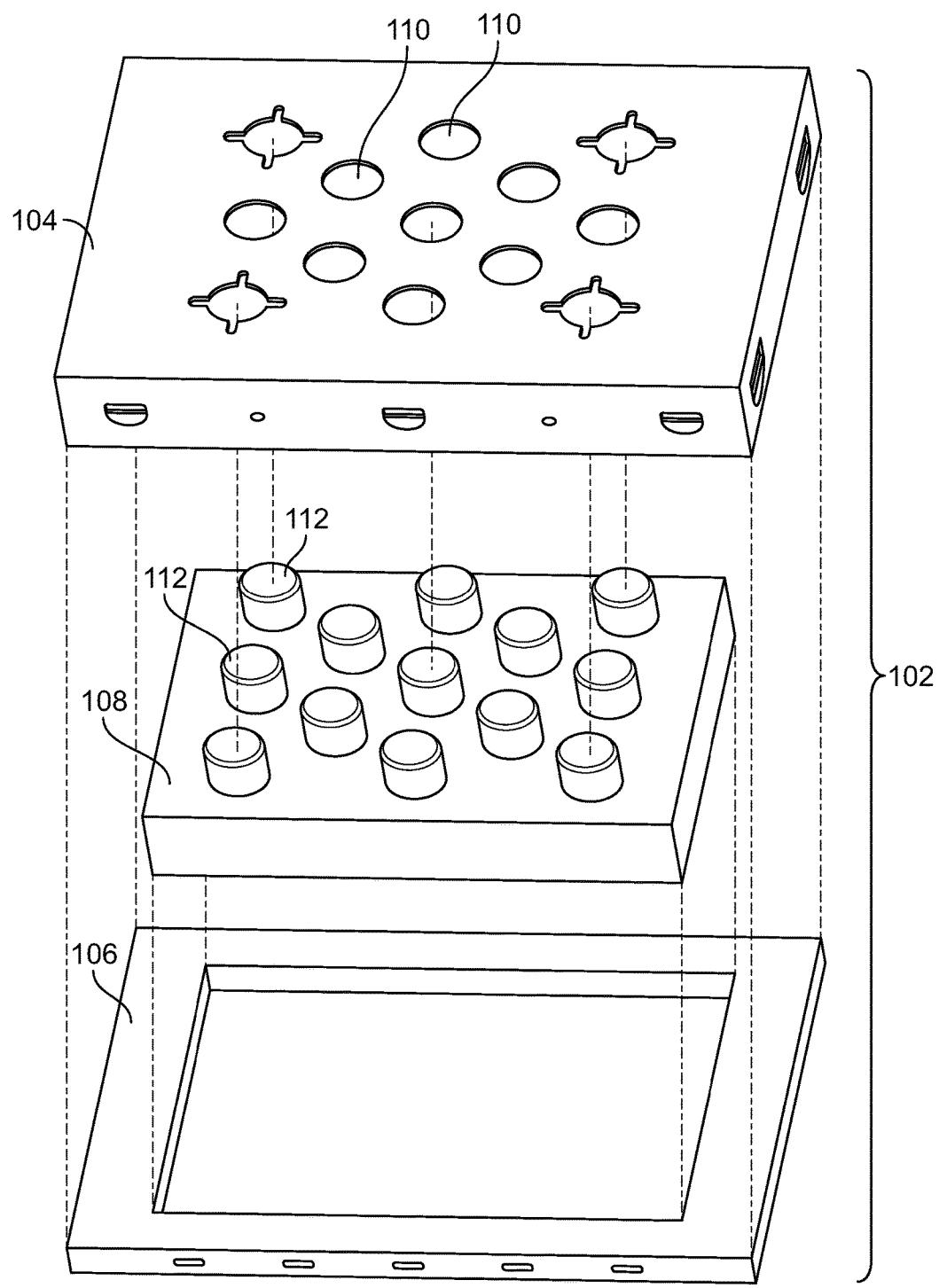
FIG. 1 shows an exploded view of an exemplary embodiment of a BLS and heat sink assembly of the disclosure, this figure highlighting the alignment of the BLS lid and fence, with respect to the heat sink, of this particular embodiment.

Referring now to the figures, FIG. 1 shows an exploded view of an embodiment of a BLS and heat sink assembly 102 of the disclosure. As shown, the assembly 102 includes a multi-piece BLS that includes a lid or cover 104 and a fence or frame 106. The assembly 102 also includes a heat sink 108 (broadly, a heat removal/dissipation structure), which itself includes a plurality of pins 112 that are complementary in shape to a series of perforations 110 on the lid 104. Various other elements shown in FIG. 1 will be further described herein.

In the embodiment of FIG. 1, the pins 112 are generally cylindrical protrusions from the top of the heat sink 108, and the perforations are generally circular apertures on the lid 104. It will be appreciated by those of skill in the art that any suitable complementary shapes of pins and perforations can be employed in the assembly of the disclosure, and the claims hereunder are not limited to the cylindrical pins in the figures. Indeed, cubes, rectangular, triangular prisms, or various other three dimensional shapes (e.g., frustrum or frustoconical shaped, etc.) could serve as suitable heat sink pins, and the BLS could have complementary perforations to permit the through passage of the pins.

Figure 2:
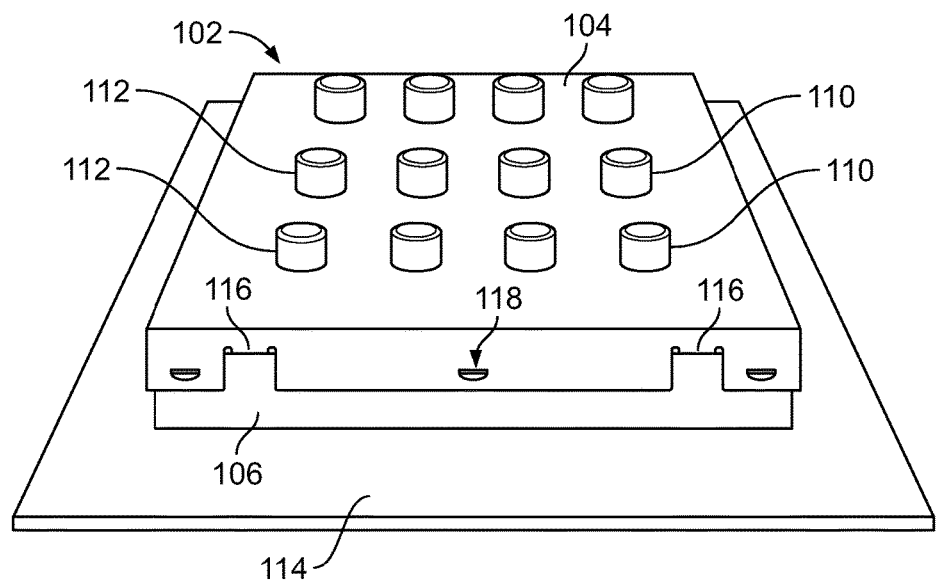
FIG. 2 shows a slightly elevated perspective view of an exemplary embodiment of a BLS and heat sink assembly of the disclosure, this particular assembly having been mounted on a PCB.

FIG. 2 shows a slightly elevated perspective view of an embodiment of a BLS and heat sink assembly 102 of the disclosure, this particular assembly having been mounted on a PCB 114. In this embodiment, the fence 106 has been mounted to the PCB 114 by any conventional mechanism, including soldering, and the lid 104 has been affixed to the fence by a latching mechanism 118.

The latching mechanism 118 may include any suitable mechanism for mechanically affixing a BLS lid to a fence, including removably affixing the lid to the fence. In this exemplary embodiment, for example, the lid includes inward hemispherical punches that snap over and lock under complementary apertures on the fence to create secure directional latching. In this way, the lid may readily snap onto the fence, but not be so readily removed from the fence without prying or without using a tool. This embodiment is not intended to be limiting, and any other suitable latching mechanism, including complementary dimples on the fence and lid, are embraced by this disclosure.

In this particular embodiment, the lid 104 includes a series of tabs 116, which are inward bends of lid material that act as compression stops for the lid 104, thereby regulating the depth of compression of the lid 104 onto the fence 106, the reasons for which will be further explained herein.

As can be seen in FIG. 2, the pins 112 and their respective complementary perforations 110 on the lid 104 permit the passage of portions of the heat sink 108 through the BLS, thereby enabling thermal flow away from any heat-generating electronic components or heat sources (not seen in FIG. 2) beneath and in thermal contact with the underside of the heat sink 108 while still providing EMI shielding to those components.

Figure 3:
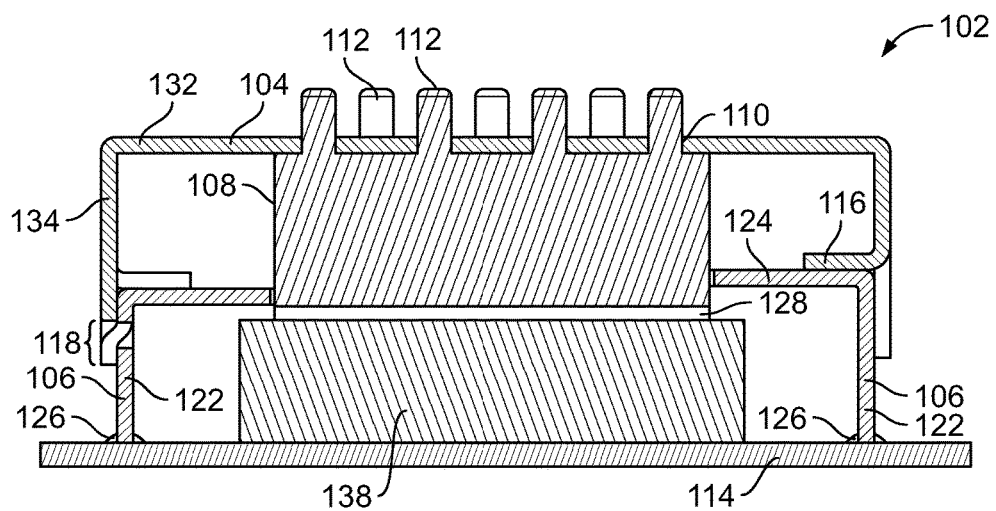
FIG. 3 shows a cross-sectional view of a portion of an exemplary embodiment of a BLS and heat sink assembly of the disclosure, this figure including details on various optional features of the assembly.

Turning to FIG. 3, which shows a cross-sectional view of a portion of an exemplary embodiment of a BLS and heat sink assembly 102 of the disclosure, one may view spatial arrangements of various components of this embodiment of the assembly. Here the fence 106 has been affixed to a PCB 114 via solder 126. The fence 106 has a sidewall 122 which is perpendicular to the PCB 114 in this embodiment. The fence 106 also includes a rail 124, which is parallel to the PCB 114 in this embodiment. The fence 106 of FIG. 3 is analogous to those seen in FIGS. 1 and 2. A heat-generating electronic component or heat source 138 is on the PCB 114, this component 138 being in need of EMI shielding during operation. A thermal interface material (TIM) 128 provides thermal contact between the heat-generating electronic component 138 and a heat sink 108 that rests atop the component 138. In this embodiment, the heat sink 108 is surrounded by the rail 124 of the fence 106, though one of skill in the art will appreciate the extensive variations in spatial arrangements and configurations of the components in FIG. 3.

FIG. 3 further illustrates the relationship of the lid 104 and the fence 106 when this exemplary embodiment of the assembly 102 is complete and mounted on a PCB 114. Specifically, the lid 104 includes a top 132 and a sidewall 134. The lid 104 is generally parallel to the PCB 114. The sidewall 134 is a perimeter of material descending downwardly from the lid 104 and perpendicular to the PCB 114. The lid 104 of FIG. 3 is analogous to those seen in FIGS. 1 and 2. The sidewall 134 of the lid 104 is configured in this embodiment to snugly fit around the sidewall 122 of the fence 106 to provide substantially gap-free EMI shielding of the heat-generating component or heat source 138 within the fence 106.

As can be seen in FIGS. 1 through 3, the lid 104 may include a series of tabs 116. FIG. 3 includes a cross sectional detail of a tab 116 as it rests on the rail 124 of the fence 106, thereby regulating the depth of compression of the heat sink 108 onto the heat-generating component or heat source 138. In such an instance, it may be desirable to have a compressible TIM 128 between the heat sink 108 and heat-generating component 138, one that does not lose thermal flow properties upon compression, and one that does not leak out from between the heat sink and heat-generating component during compression. One of skill in the art will appreciate that a variety of TIMs could be used in this application, including those that are at least partially compressible. A compressible TIM may also be positioned between the underside of the lid and the top of the heat sink in other exemplary embodiments.

FIG. 3 further includes details on an embodiment of a latching mechanism 118 to keep the lid 104 directionally securely affixed to the fence 106. In this embodiment, the lid sidewall 134 includes a series of inward hemispherical punches that snap over and lock under a series of complementary apertures on the fence sidewall 122.

As can be seen in FIG. 3, the pins 112 on the heat sink 108 pass through the top 132 of the lid 104 via a series of complementarily shaped perforations 110 thereon. Additional background pins 112 can be seen in this view, as the pins have been arranged in a staggered matrix. Any spatial arrangement of the pins may be employed in the assembly of this disclosure, and the configurations seen in the figures are merely illustrative and not intended to be limiting in any way.

Figure 4:
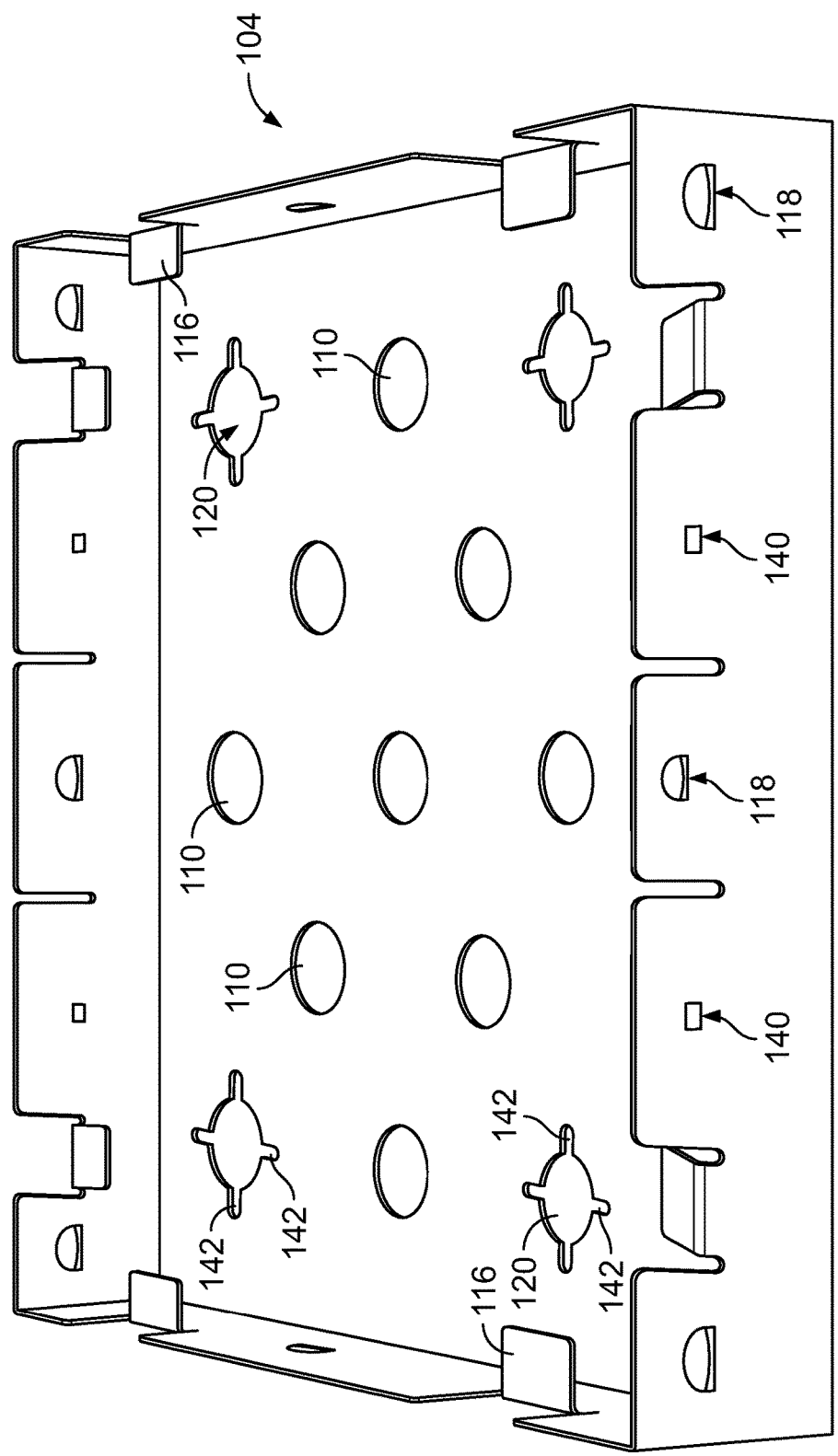
FIG. 4 shows an underside view of an exemplary embodiment of the BLS lid of a BLS and heat sink assembly of the disclosure, this figure including details on various optional features of the BLS lid.

Turning to FIG. 4, which shows the underside view of an exemplary embodiment of the BLS lid 104 of the assembly of the disclosure, additional details may be seen. Here the perforations 110 have been arranged in a staggered matrix. Additionally, in this embodiment, the lid 104 includes four press fit perforations 120 at about or adjacent the corresponding four corners of the heat sink 108. The press fit perforations 120 are perforations configured to include one or more openings or cavities 142 along the outer rim of the perforations 120. In this particular embodiment, each press fit perforation 120 includes four cavities 142 that are 90 degrees apart from one another around the radius of the circular perforation. Press fit perforations 120, when present, may enable a snug adherence of the heat sink to the BLS, or the BLS lid when a lid and fence are present. As will be seen later, the press fit perforations 120 may be of at least a partially smaller diameter than the other perforations 110 that do not include any cavities 142. In this way, for example, some cylindrical heat sink pins of uniform diameter would snugly slide through complementary perforations 110 on the lid, while other pins would even more snugly slide through press fit perforations 120, resulting in an at least partial bending of a portion of the BLS near the cavities 142, thereby creating a tight hold of the BLS against the heat sink pins. The heat sink pins and the lid's perforations may be configured (e.g., with a sufficient friction or interference fit, etc.) to be sufficient to retain the heat sink to the lid during transport prior to installation of the lid onto the fence. In another embodiment, the shape and diameter of the press fit perforations 120 and the other perforations 110 are substantially similar, but the heat sink pins 112 are configured such that the pins to mate with the press fit perforations are of a slightly smaller diameter than those not intended to mate with press fit perforations.

FIG. 4 also includes an exemplary embodiment where not only are the inward hemispherical punches (e.g., D-shaped snap lances, etc.) as a part of the directional latching mechanism 118 present on the lid 104, but a series of dimples 140 are also present on the lid, these dimples corresponding to complementary dimple shapes on the fence sidewall 122. In this way, for example, a plurality of methods of affixing a lid to a fence may be used.

Figure 5:
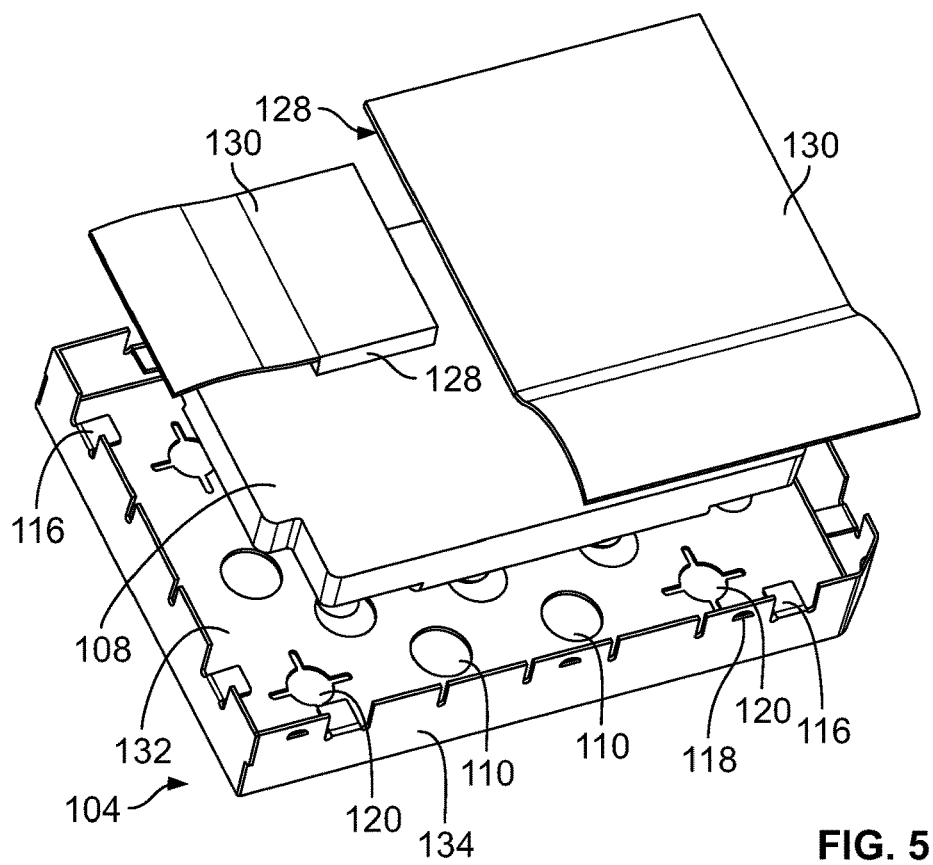
FIG. 5 shows an underside exploded view of an exemplary embodiment of the BLS lid and a heat sink of the BLS and heat sink assembly of the disclosure, this figure including thermal interface materials and additional optional details of the BLS lid.

FIG. 5 shows an underside exploded view of an embodiment of the BLS lid 104 and a heat sink 108 of the BLS and heat sink assembly of the disclosure, this figure including thermal interface materials 128 and additional optional details of the BLS lid. In this figure, two separate TIMs 128 may be adhered to the underside of the heat sink 108, each TIM including a release liner 130 to protect the underside of the TIM from contamination before applying the lid/BLS/TIM assembly onto a fence/heat-generating component/PCB assembly. Other features previously discussed herein such as the press fit perforations 120, lid tab 116, and directional latching mechanism 118 are also visible in this figure.

Figure 6:
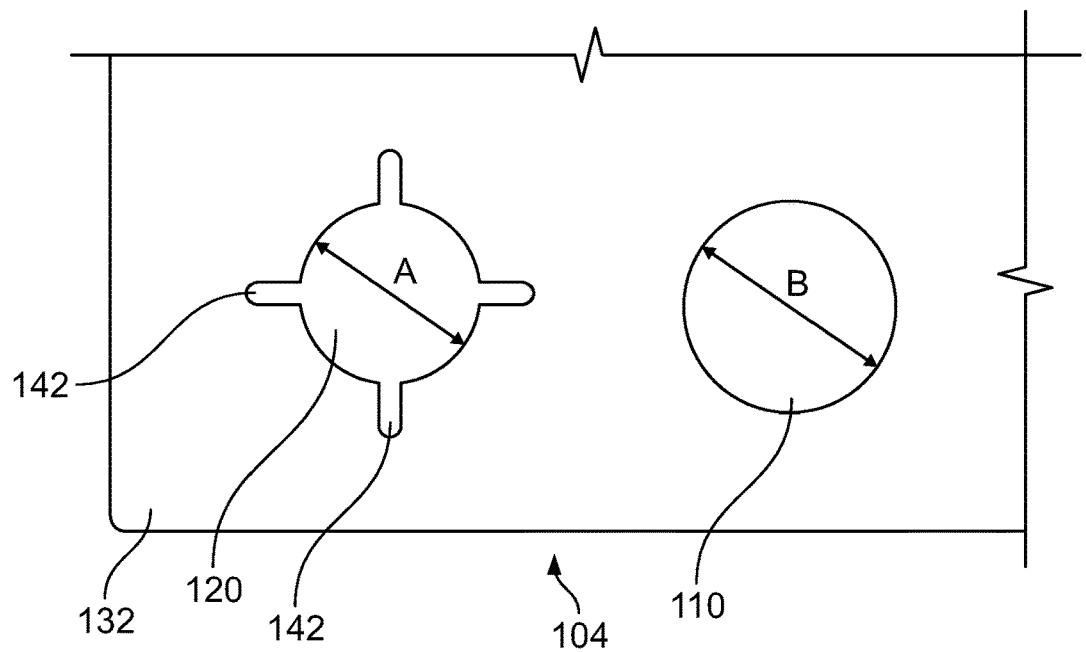
FIG. 6 shows a top view of a portion of an exemplary embodiment of the BLS lid of the BLS and heat sink assembly of the disclosure, this figure highlighting various perforations in the BLS lid and their relative dimensions.

FIG. 6 shows a top view of a portion of an exemplary embodiment of the BLS lid 104 of the BLS and heat sink assembly of the disclosure, this figure highlighting various perforations 110, 120 in the BLS lid and their relative dimensions when the BLS pins are of substantially uniform diameter, as discussed previously. Here, the diameter A of the press fit perforation 120 is slightly smaller than the diameter B of the other generally round perforation 110. In this way, two separate heat sink pins of diameter B would both fit through the perforations 110, 120, though the fit through the press fit perforation 120 would result in an at least partial bending of a portion of the BLS near the cavities 142, thereby creating a tight hold of the BLS against the heat sink pins.

Figure 7:
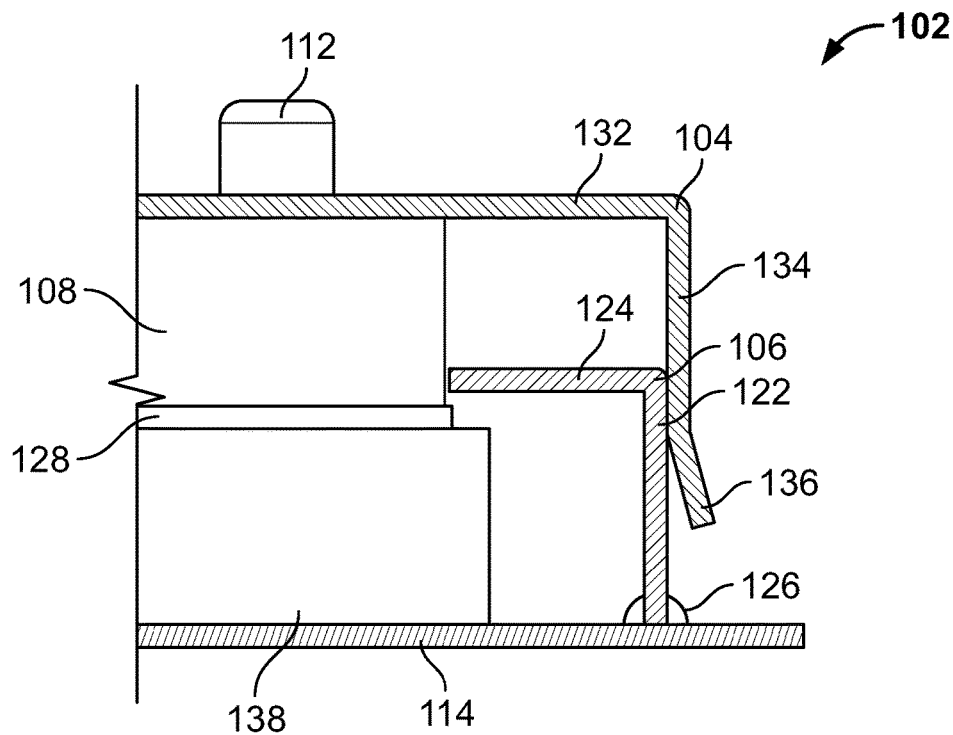
FIG. 7 shows a partial cross-sectional view of a portion of an exemplary embodiment of a BLS and heat sink assembly of the disclosure, this figure highlighting an optional feature of the BLS lid.

FIG. 7 shows a partial cross-sectional view of a portion of an exemplary embodiment of a BLS and heat sink assembly 102 of the disclosure, this figure highlighting an optional feature of the BLS lid 104. Where certain machine assembly steps of an electrical device might include placing a lid 104 over the fence 106, it may be difficult in certain instances to achieve rapid mounting of many lids to fences with pinpoint accuracy. Thus, in an exemplary embodiment, the lower portion of the sidewall 134 of the lid 104 includes a flared rim 136, where, along a section of or the entirety of the bottom lip of the sidewall 134 of the lid 104, the bottom portion of the sidewall is at least partially bent away from a concave region of the lid 104. This bend permits a margin of error in assembling electronic devices that include the assembly of the disclosure. The flared rim 136 creates a wider area and longer perimeter under the lid 104 to mate with the fence 106, while still maintaining a snug fit and providing EMI shielding protection as the lid 104 is pressed down on to the fence 106.

Figure 8:
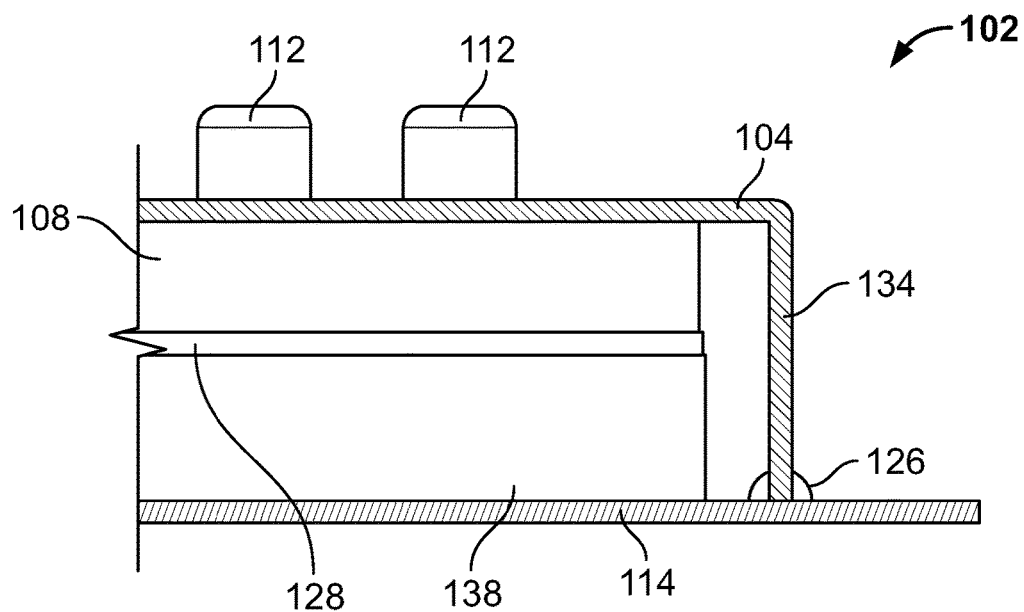
FIG. 8 shows a partial cross-sectional view of a portion of an exemplary embodiment of a BLS and heat sink assembly of the disclosure, this figure showing a single piece BLS soldered to a PCB, in the absence of a BLS fence.
Figure 9:
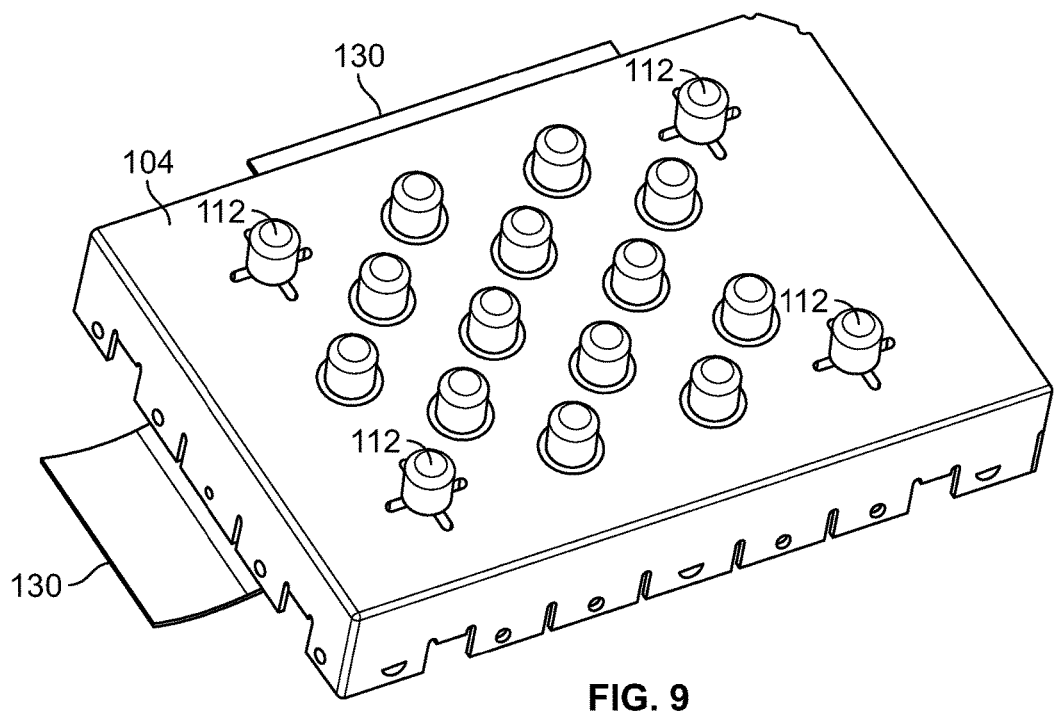
FIGS. 9 and 10 show upper and lower perspective views of an exemplary embodiment of a BLS and heat sink assembly of the disclosure.

FIG. 8 shows a partial cross-sectional view of a portion of an exemplary embodiment of a BLS and heat sink assembly 102 of the disclosure, this figure showing a single piece BLS soldered to a PCB 114, in the absence of a BLS fence. Where the BLS is a single piece, there is no need for any directional latching or compression tabs on the BLS, and the sidewall 134 of the BLS is affixed to the PCB directly, for example via solder 126. This configuration in FIG. 8 will not allow ready access to the electrical components under the shield by a user, though that may not be desired in all applications. However, this configuration might be combined with board level shields that include peelable or otherwise removable portions of a single piece shield to permit access to the components.

Figure 17:
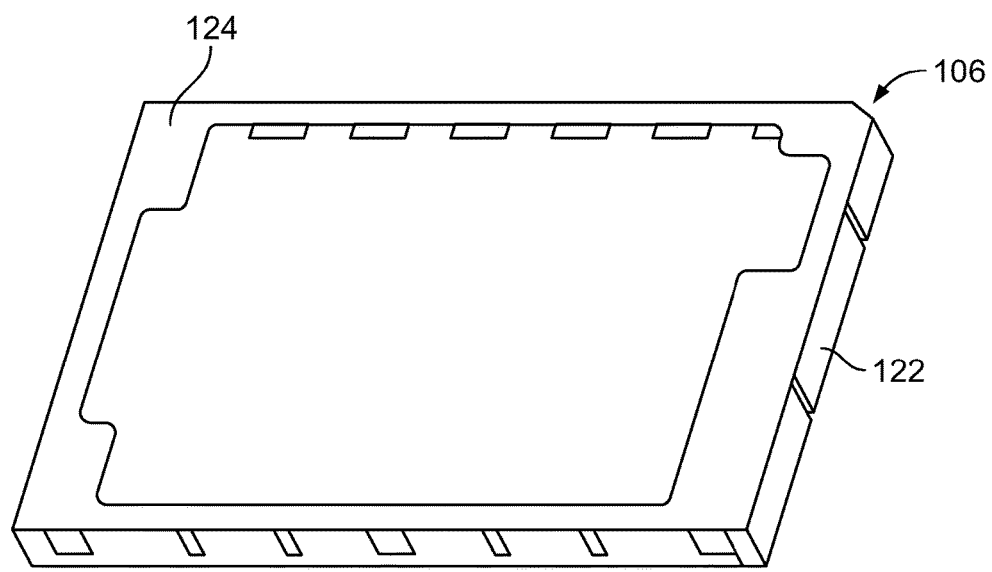
FIG. 17 shows a perspective view of the fence of the BLS and heat sink assembly shown in FIGS. 9 and 10.

FIGS. 9 through 18 illustrate an exemplary embodiment of a BLS and heat sink assembly 102 embodying one or more aspects of the present disclosure. As shown, the assembly 102 includes a multi-piece BLS that includes a lid or cover 104 (FIGS. 9-14) and a fence or frame 106 (FIG. 17). The assembly 102 also includes a heat sink 108 (broadly, a heat removal/dissipation structure). As shown in FIGS. 9, 11, and 13-16, the heat sink 108 includes a plurality of pins 112 that are complementary in shape to a series of perforations 110 (FIG. 18) on the lid 104.

The pins 112 may be arranged in a staggered matrix. But any spatial arrangement of the pins may be employed in the assembly of this disclosure, and the configurations seen in the figures are merely illustrative and not intended to be limiting in any way.

The pins 112 are generally cylindrical protrusions from the top of the heat sink 108, and the perforations are generally circular apertures on the lid 104. It will be appreciated by those of skill in the art that any suitable complementary shapes of pins and perforations can be employed in the assembly of the disclosure, and the claims hereunder are not limited to the cylindrical pins in the figures. Indeed, cubes, rectangular, triangular prisms, or various other three dimensional shapes (e.g., frustrum or frustoconical shaped, etc.) could serve as suitable heat sink pins, and the BLS could have complementary perforations to permit the through passage of the pins.

Figure 18:
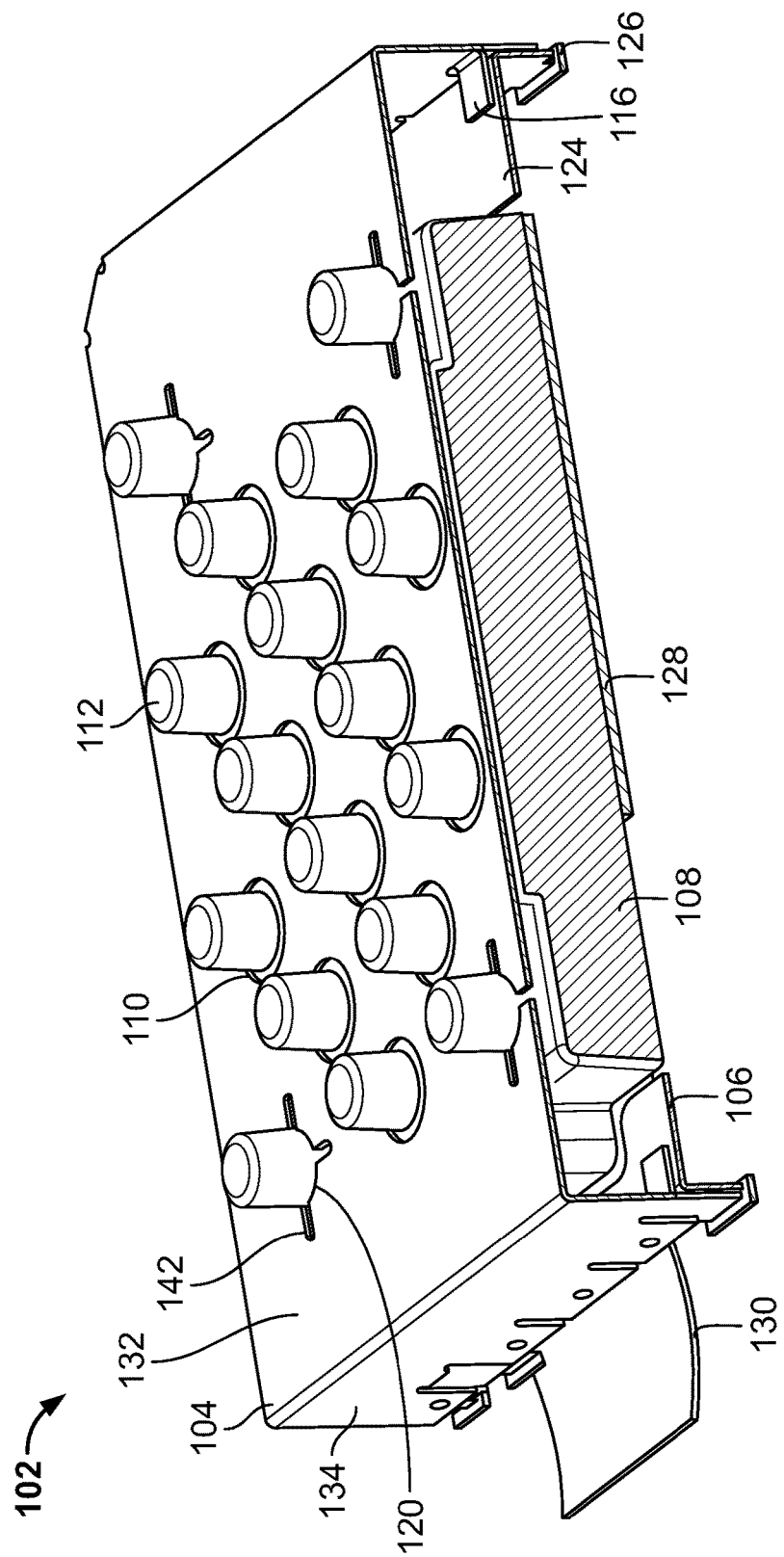
FIG. 18 shows a partial cross-sectional perspective view of the BLS and heat sink assembly shown in FIGS. 9 and 10.

As shown in FIG. 18, the fence 106 may include solder 126 (e.g., solder pads, etc.) along a bottom of the fence 106. The solder 126 may be used for mounting the fence 106 to a PCB. FIG. 18 also shows the lid 104 affixed to the fence 106 by a latching mechanism.

The latching mechanism may include any suitable mechanism for mechanically affixing a BLS lid to a fence, including removably affixing the lid to the fence. In this exemplary embodiment, for example, the lid may include inward hemispherical punches that snap over and lock under complementary apertures on the fence to create secure directional latching. In this way, the lid may readily snap onto the fence, but not be so readily removed from the fence without prying or without using a tool. This embodiment is not intended to be limiting, and any other suitable latching mechanism, including complementary dimples on the fence and lid, are embraced by this disclosure.

In this particular embodiment, the lid 104 includes a series of tabs 116, which are inward bends of lid material that act as compression stops for the lid 104, thereby regulating the depth of compression of the lid 104 onto the fence 106 and the depth of compression of the heat sink 108 onto the heat-generating component or heat source. In such an instance, it may be desirable to have a compressible TIM 128 between the heat sink 108 and heat-generating component or heat source, one that does not lose thermal flow properties upon compression, and one that does not leak out from between the heat sink 108 and heat-generating component during compression. One of skill in the art will appreciate that a variety of TIMs could be used in this application, including those that are at least partially compressible. A compressible TIM may also be positioned between the underside of the lid and the top of the heat sink in other exemplary embodiments.

As can be seen in FIG. 18, the pins 112 and their respective complementary perforations 110 on the lid 104 permit the passage of portions of the heat sink 108 through the BLS, thereby enabling thermal flow away from any heat-generating electronic components or heat sources beneath and in thermal contact with the underside of the heat sink 108 while still providing EMI shielding to those components.

As shown in FIG. 17, the fence 106 has a sidewall 122 and a rail or inwardly extending perimeter flange 124. As shown in FIG. 18, the lid 104 includes a top 132 and a sidewall 134. The sidewall 134 is a perimeter of material descending downwardly from the lid 104 and perpendicular to the top 132. The sidewall 134 of the lid 104 may be configured to snugly fit around the sidewall 122 of the fence 106 to provide substantially gap-free EMI shielding of the heat-generating component or heat source within the fence 106.

The perforations 110 have been arranged on the lid 104 in a staggered matrix. Additionally, in this embodiment, the lid 104 includes four press fit perforations 120 at about or adjacent the corresponding four corners of the heat sink 108. The press fit perforations 120 are perforations configured to include one or more openings or cavities 142 along the outer rim of the perforations 120. In this particular embodiment, each press fit perforation 120 includes four cavities 142 that are 90 degrees apart from one another around the radius of the circular perforation. Press fit perforations 120, when present, may enable a snug adherence of the heat sink 108 to the BLS lid 104. The press fit perforations 120 may be of at least a partially smaller diameter than the other perforations 110 that do not include any cavities 142. In this way, for example, some cylindrical heat sink pins 112 of uniform diameter would snugly slide through complementary perforations 110 on the lid 104, while other pins 112 would even more snugly slide through press fit perforations 120, resulting in an at least partial bending of a portion of the BLS lid 104 near the cavities 142, thereby creating a tight hold of the BLS lid 104 against the heat sink pins 112. The heat sink pins 112 and the lid's perforations may be configured (e.g., with a sufficient friction or interference fit, etc.) to be sufficient to retain the heat sink 108 to the lid 104 during transport prior to installation of the lid 104 onto the fence 106. In another embodiment, the shape and diameter of the press fit perforations 120 and the other perforations 110 are substantially similar but the heat sink pins 112 are configured such that the pins to mate with the press fit perforations are of a slightly smaller diameter than those not intended to mate with press fit perforations.

Figure 10:
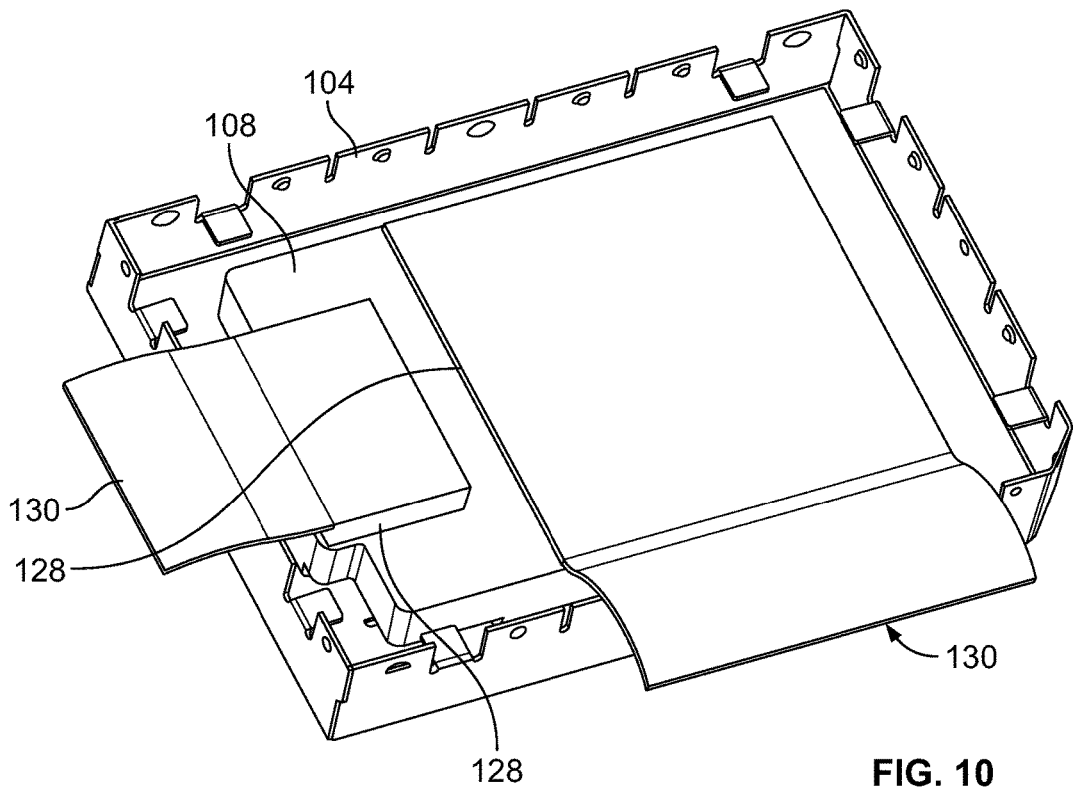
Figure 11:
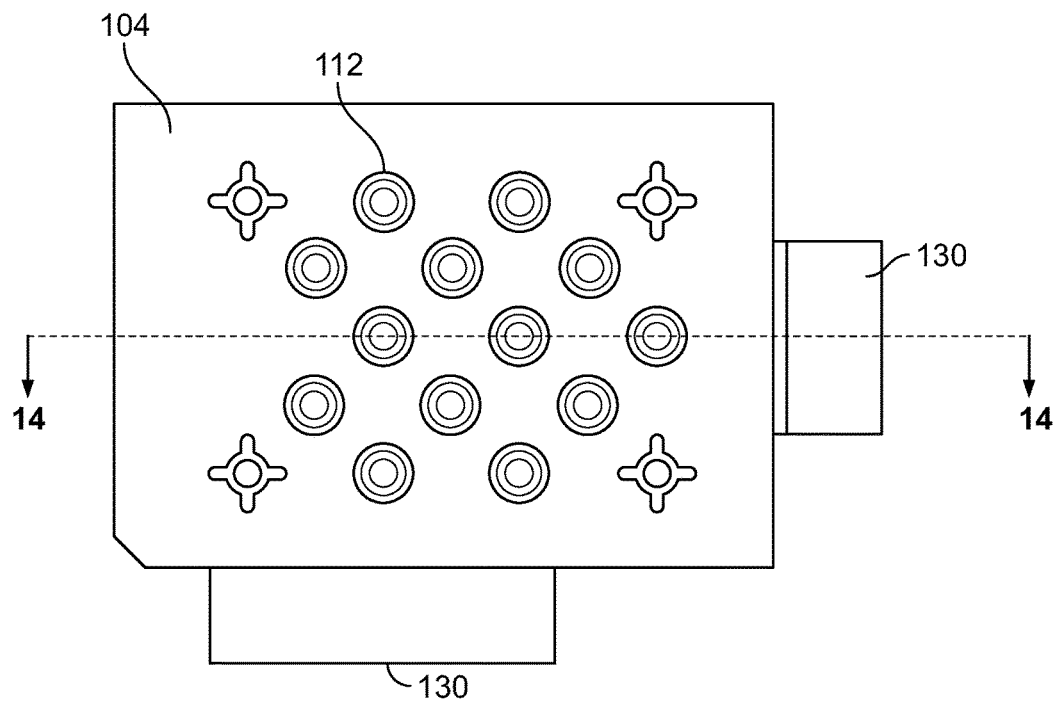
FIG. 11 shows a top view of the BLS and heat sink assembly shown in FIGS. 9 and 10.
Figure 12:
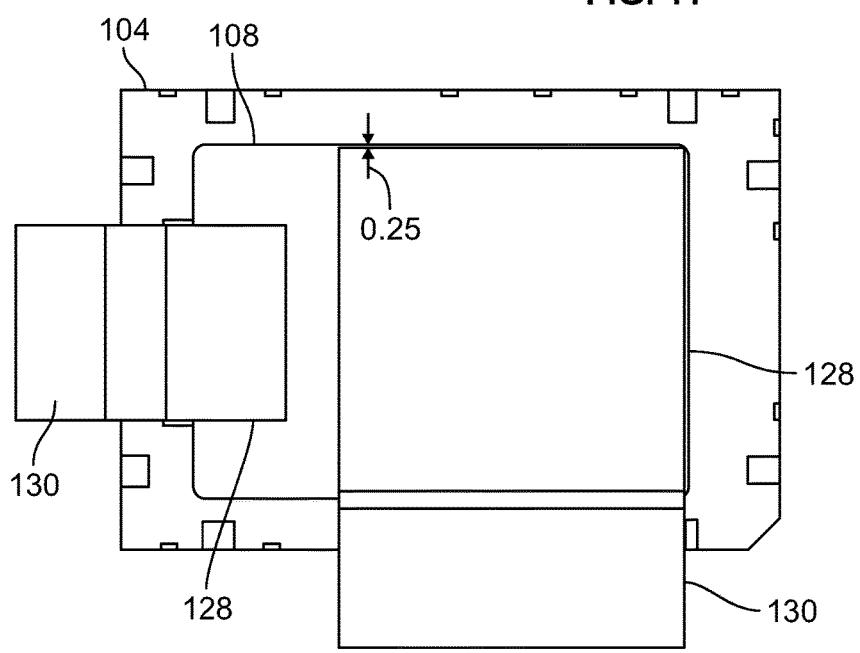
FIG. 12 shows a bottom view of the BLS and heat sink assembly shown in FIGS. 9 and 10 along with an exemplary dimension in millimeters provided for purposes of illustration only according to this exemplary embodiment.
Figure 13:
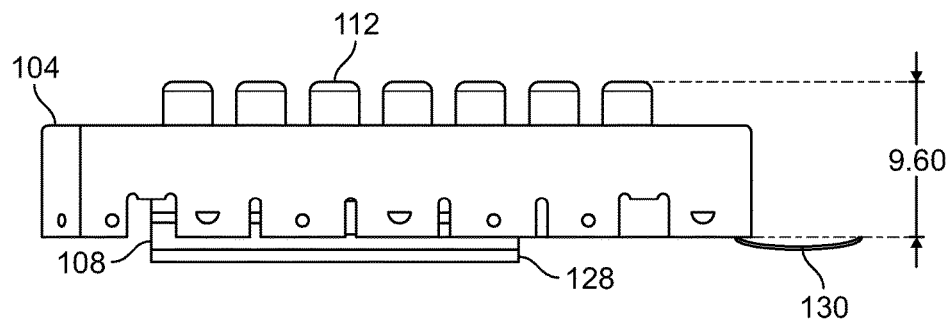
FIG. 13 shows a side view of the BLS and heat sink assembly shown in FIGS. 9 and 10 along with an exemplary dimension in millimeters provided for purposes of illustration only according to this exemplary embodiment.
Figure 14:
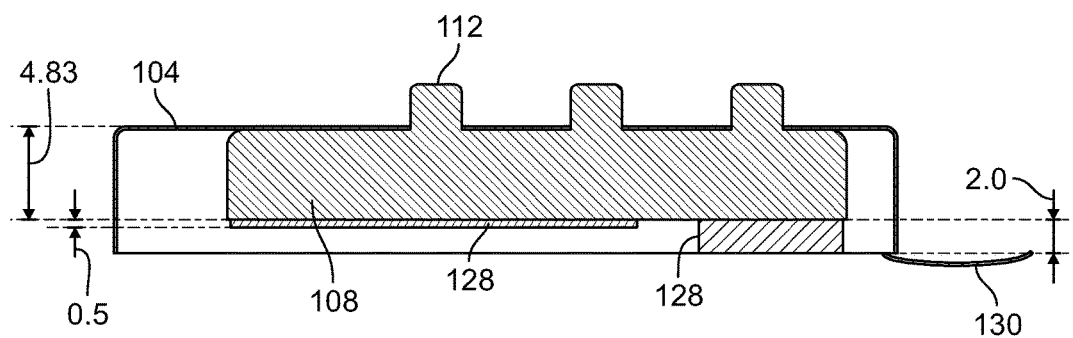
FIG. 14 shows a cross-sectional view of the BLS and heat sink assembly shown in FIGS. 9 and 10 taken along the line A-A in FIG. 11 and with exemplary dimensions in millimeters provided for purposes of illustration only according to this exemplary embodiment.
Figure 15:
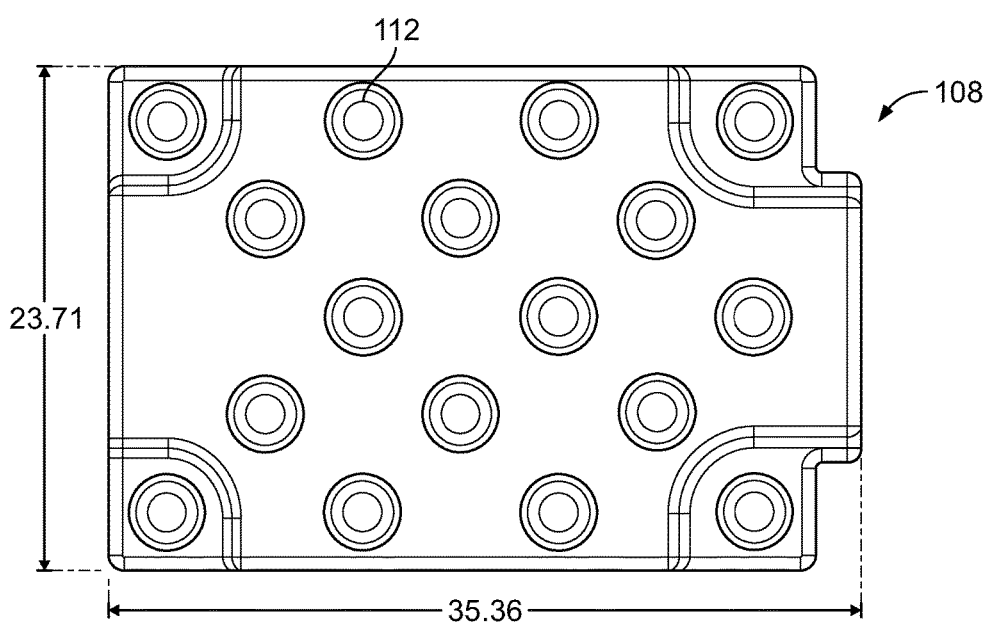
FIG. 15 shows a top view of the heat sink of the BLS and heat sink assembly shown in FIGS. 9 and 10 along with exemplary dimensions in millimeters provided for purposes of illustration only according to this exemplary embodiment.
Figure 16:
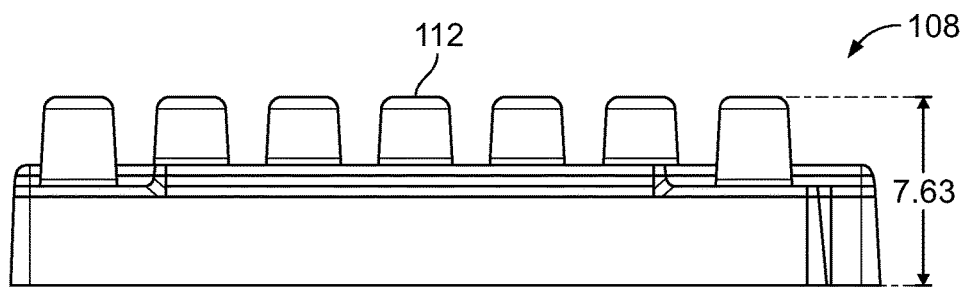
FIG. 16 shows a side view of the heat sink shown in FIG. 15 along with an exemplary dimension in millimeters provided for purposes of illustration only according to this exemplary embodiment.

As show in FIG. 10, the lid 104 includes inward hemispherical punches (e.g., D-shaped snap lances, etc.) as a part of the directional latching mechanism present on the lid 104. The lid 104 also includes a series of dimples 140 that correspond to complementary dimple shapes on the fence sidewall 122. In this way, for example, a plurality of methods of affixing the lid 104 to the fence 106 may be used.

As shown in FIG. 10, thermal interface materials (TIM) 128 are provided for making thermal contact with a heat source or heat-generating electronic component and the heat sink 108. In this figure, two separate TIMs 128 may be adhered to the underside of the heat sink 108, each TIM including a release liner 130 to protect the underside of the TIM from contamination before applying the lid/BLS/TIM assembly onto a fence/heat-generating component/PCB assembly. The release liners 130 may be removed before mounting the BLS to a PCB, e.g., before removably attaching the lid 104 to the fence 106 and/or before soldering the fence 106 to a PCB, etc.

Figure 19:
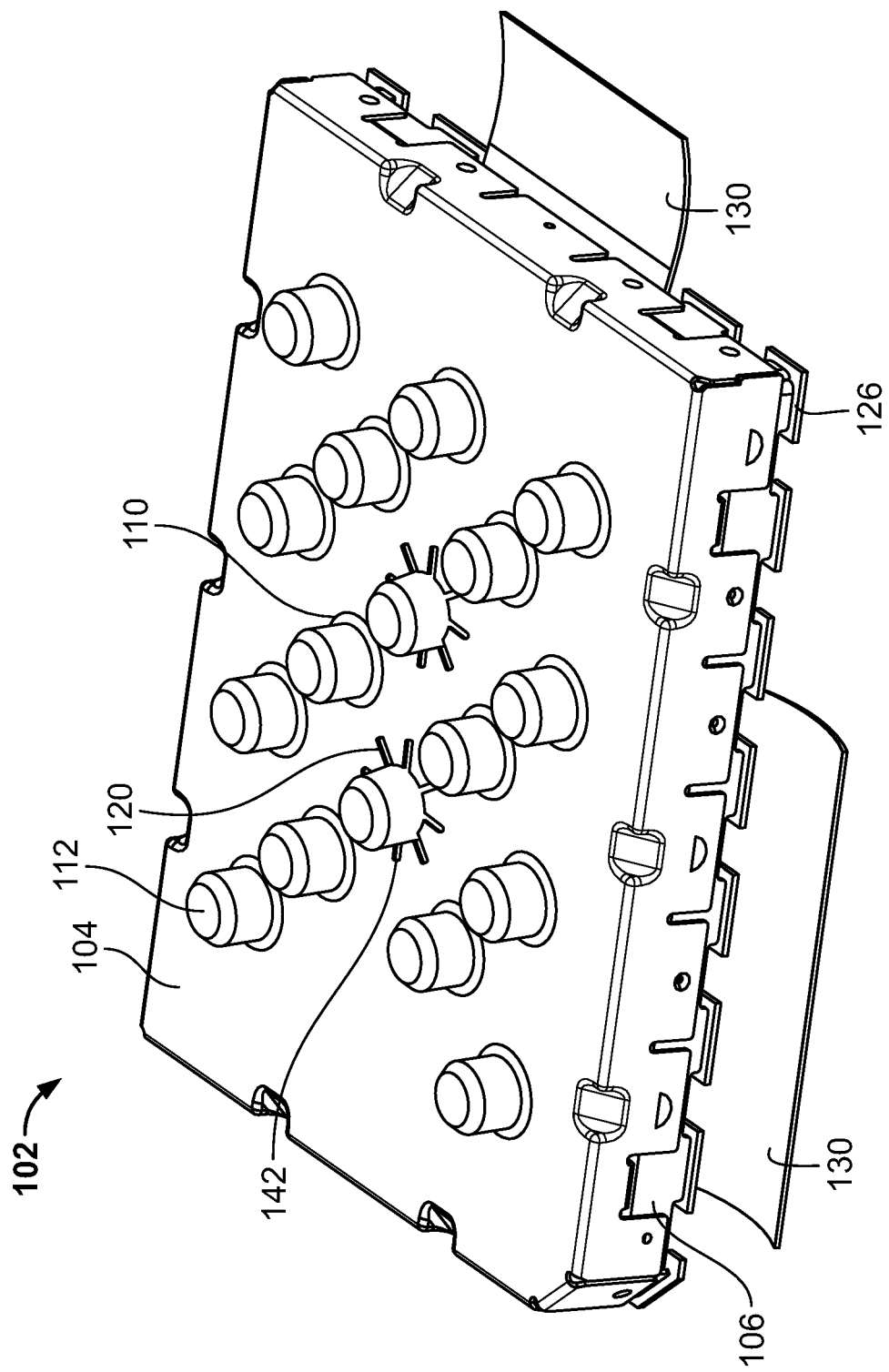
FIG. 19 shows a perspective view of an exemplary embodiment of a BLS and heat sink assembly of the disclosure.

FIG. 19 illustrates an exemplary embodiment of a BLS and heat sink assembly 102 embodying one or more aspects of the present disclosure. As shown, the assembly 102 includes a multi-piece BLS that includes a lid or cover 104 and a fence or frame 106. The assembly 102 also includes a heat sink (broadly, a heat removal/dissipation structure).

The lid 104, fence 106, and heat sink shown in FIG. 19 may be identical or similar to a lid 104, fence 106, and heat sink 108 described above. For example, the heat sink includes a plurality of protrusions or pins 112 that are complementary in shape to a series of openings or perforations 110 on the lid 104. FIG. 19 also shows solder pads 126 along a bottom of the fence 106 and release liners 130 that may be disposed over thermal interface materials along an underside of the heat sink 108.

In this exemplary embodiment, the perforations 110 have again been arranged on the lid 104 in a staggered matrix. But in this embodiment, the lid 104 includes two press fit perforations 120 at about or adjacent a middle or center portion of the heat sink 108. The press fit perforations 120 are configured to include one or more openings or cavities 142 along the outer rim of the perforations 120. In this particular embodiment, each press fit perforation 120 includes eight cavities 142 that are 45 degrees apart from one another around the radius of the circular perforation. Press fit perforations 120, when present, may enable a snug adherence of the heat sink 108 to the BLS lid 104. The press fit perforations 120 may be of at least a partially smaller diameter than the other perforations 110 that do not include any cavities 142. In this way, for example, some cylindrical heat sink pins 112 of uniform diameter would snugly slide through complementary perforations 110 on the lid 104, while other pins 112 would even more snugly slide through press fit perforations 120, resulting in an at least partial bending of a portion of the BLS lid 104 near the cavities 142, thereby creating a tight hold of the BLS lid 104 against the heat sink pins 112. The heat sink pins 112 and the lid's perforations may be configured (e.g., with a sufficient friction or interference fit, etc.) to be sufficient to retain the heat sink 108 to the lid 104 during transport prior to installation of the lid 104 onto the fence 106. In another embodiment, the shape and diameter of the press fit perforations 120 and the other perforations 110 are substantially similar but the heat sink pins 112 are configured such that the pins to mate with the press fit perforations are of a slightly smaller diameter than those not intended to mate with press fit perforations.

As used herein, the heat sink may be a block of metal, such as copper or aluminum (e.g., anodized aluminum, aluminum die cast, ADC 12 aluminum alloy, other aluminum alloys, etc.), or other thermally conductive material, such as thermally-conductive polymer composites, that have, for example, been skived, molded, or extruded to create a series of base that includes at least one pin thereon. In an exemplary embodiment where the heat sink is comprised of a thermally-conductive polymer composite, the heat sink may be made through injection molding or thermoset molding.

Although the BLS in the figures is shown having a generally rectangular shape, this is not intended to be limiting. Alternative embodiments may include shields having different configurations (e.g., circular, curved, triangular, irregular, other non-rectangular shapes, etc.). The shapes and dimensions provided in this application are for purpose of illustration only as other exemplary embodiments may have a different configuration, such as a different size (e.g., larger or smaller) and/or a different shape (e.g., non-rectangular, etc.), etc.

The BLS disclosed herein may be formed from a wide range of materials, including by way of example metals and/or electrically-conductive materials. For example, the BLS may be formed from metals or metal alloys, such as cold rolled steel (e.g., tin-plated cold rolled steel, etc.), sheet metal, stainless steel, copper alloys (e.g., tin-plated copper alloys, etc.), nickel-silver alloys (e.g., nickel-silver alloy, etc.), copper-nickel alloys, carbon steel, brass, copper, aluminum, copper-beryllium alloys, phosphor bronze, steel, alloys thereof, among other suitable electrically-conductive materials. The BLS may also be formed from a plastic material coated with electrically-conductive material. The materials provided herein are for purposes of illustration only, as the shield may be made from different materials depending, for example, on the particular application, such as the electrical components to be shielded, space considerations within the overall electronic device, EMI shielding and heat dissipation needs, and other factors.

A wide range of thermal interface materials may be used in exemplary embodiments, such as thermal gap fillers, thermal phase change materials, thermally-conductive EMI absorbers or hybrid thermal/EMI absorbers, thermal greases, thermal pastes, thermal putties, dispensable thermal interface materials, thermal pads, etc. For example, the thermal interface material may include one or more of a compliant or conformable thermal interface pad, putty, or gap filler. The TIM may be a conformable and/or flowable thermal interface material having sufficient compressibility, flexibility, deformability, and/or flowability to allow the thermal interface material to relatively closely conform to the size and outer shape of the heat generating component and the underside of the heat sink, thereby removing air gaps therebetween. The TIM may also be a form-in-place material that may be dispensed in place onto the shielding apparatus. Suitable TIMs for use in this disclosure may comprise thermally conductive compliant materials or thermally conductive interface materials formed from ceramic particles, metal particles, ferrite EMI/RFI absorbing particles, metal or fiberglass meshes in a base of rubber, gel, grease or wax, for example. Suitable TIMs for use in this disclosure may alternatively comprise a thermally-conductive compliant material or thermally conductive interface material formed from ceramic particles, metal particles, ferrite EMI/RFI absorbing particles, metal or fiberglass meshes in a base of rubber, gel, grease or wax, for example. In another example, a suitable TIM may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermal putties, thermal greases, thermally-conductive additives. A TIM may be configured to have sufficient conformability, compliability, and/or softness to allow the TIM material to closely conform to a mating surface when placed in contact with the mating surface, including a non-flat, curved, or uneven mating surface. A TIM may comprise an electrically conductive soft thermal interface material formed from elastomer and at least one thermally-conductive metal, boron nitride, and/or ceramic filler, such that the soft thermal interface material is conformable even without undergoing a phase change or reflow. The TIM may be a non-metal, non-phase change material that does not include metal and that is conformable even without undergoing a phase change or reflow. A TIM may comprise a thermal interface phase change material. A TIM may comprise one or more conformable thermal interface material gap filler pads having sufficient deformability, compliance, conformability, compressibility, flowability, and/or flexibility for allowing a pad to relatively closely conform (e.g., in a relatively close fitting and encapsulating manner, etc.), to the size and outer shape of another component. Also, the thermal interface material gap filler pad may be a non-phase change material and/or be configured to adjust for tolerance or gap by deflecting.

By way of example only, an exemplary embodiment may include first and second thermal interface materials (e.g., 128 in FIGS. 5 and 10, etc.) comprising compliant gap filler thermal interface material having a compression range 10-40%, a hardness of 35 to 40 (Shore 00), a thermal conductivity of 3 Watts per meter Kelvin (W/mK) per ASTM D5470, electrically insulating stable from −45° C. thru 200° C., and meet UL 94V0. The first thermal interface material may have dimensions of 2.32 millimeters (mm)× 2.32 mm×0.5 mm thick. The second thermal interface material may have dimensions of 8.1 mm×13.1 mm×2 mm thick. The first and second thermal interface materials may comprise a ceramic filled silicone sheet.

One of skill in the art will appreciate that an assembly of this disclosure may provide shielding, thermal management, or both, for one or a plurality of components, including instances where components have diverse EMI shielding and/or thermal management needs, and including instances where components have a variety of shapes and heights. The shape of the heat sink or thickness and shape of any TIMs may be adjusted to permit the shielding, thermal management, or both, for one or a plurality of components by an assembly of the disclosure.

As the heat sink delivers thermal flow away from the heat-generating electrical component or heat source in the assembly of the disclosure, the pins may radiate the heat into, for example, ambient air, or may be covered by a fan or fan and shroud assembly to create an air flow. In another embodiment, the pins may make contact with a fluid, including a fluid that facilitates thermal transfer, where the fluid may be flowing to facilitate further thermal transfer. The pins in another embodiment may make physical contact, either directly or via one or more thermal interface materials, with another element that may accept some of the thermal energy.

Though a latching mechanism has been shown in the Figures, additional mechanisms known in the art for securely, and optionally removably, latching a lid to a fence or frame are embraced by the spirit of this disclosure. By way of non-limiting examples, the latching mechanisms seen in U.S. Patent Application Publication No. 2014/0262473, PCT Patent Application No. PCT/US2015/60554, and U.S. Pat. Nos. 7,491,889 and 7,504,592 may be suitable latching mechanisms for use in the present disclosure.

By way of example only, exemplary embodiments disclosed herein may include a frame having corner sections with drawn portions that are similar or identical to the frames with corner sections having drawn portions as disclosed in U.S. Pat. No. 7,488,902.

Additionally, by way of example only, exemplary embodiments disclosed herein may include a cover, frame, and/or thermal interface material similar or identical to a frame, cover and/or thermal interface material as disclosed in U.S. Pat. No. 7,623,360.

Thus, as can be seen from the above detailed description and the various figures, a variety of embodiments are included within the scope of this disclosure. Among those embodiments, this disclosure includes a shielding assembly having a board level shield and a heat sink, the heat sink having a top, a bottom, and sides. In this embodiment, the board level shield includes a fence or frame and a lid or cover, where a fence is a perimeter of material around the sides of the heat sink, and where a lid is a piece of material having a shape complementary to the perimeter of the fence, the lid being attachable to the fence to substantially enclose the top of the heat sink. The lid may further include at least one perforation (broadly, opening). The heat sink may be made of a thermally conductive material having at least one pin (broadly, a protrusion or protruding portion) on the top of the heat sink, where a pin is a protrusion of the thermally conductive material from the heat sink. In this embodiment, the at least one pin and the at least one perforation are complementary in shape such that when the lid is attached to the fence, the at least one pin at least partially protrudes through the at least one perforation.

Optionally, the lid may further include a top and lid sidewall, where the lid sidewall is a descending width of material perpendicular from the top, wherein the lid sidewall substantially surrounds the fence when the lid is attached to the fence. In another embodiment, the fence includes a fence sidewall and a rail, where the fence sidewall is a perimeter of material substantially perpendicular to the top of the heat sink, and where the rail is a perimeter of material substantially parallel to the top of the heat sink, meeting the fence sidewall at a bend, where the rail proceeds from the fence sidewall towards the heat sink.

In an exemplary embodiment, the heat sink includes a plurality of pins and a plurality of perforations, where the pins and perforations are arranged in a complementary manner such that when the lid is attached to the fence, the pins protrude through the perforations. The assembly may also include at least one latching mechanism to securely attach the lid to the fence, and the at least one latching mechanism is a removable directional latching mechanism.

The shielding assembly may also include a thermal interface material, where the thermal interface material is adhered to the bottom of the heat sink.

The shielding assembly lid may also include at least one press fit perforation.

In an exemplary embodiment, the assembly lid sidewall further includes a plurality of tabs, where tabs are material inwardly bent or bending towards the concave portion of the lid, the tabs being substantially perpendicular to the lid sidewall, where, when the lid is attached to the fence, the tabs rest on the rail.

In another exemplary embodiment, the shielding assembly includes a board level shield, a heat sink, at least one heat-generating electrical component or heat source, and a printed circuit board, where the at least one heat-generating electrical component is affixed to the printed circuit board and is in thermal contact with the heat sink. In this embodiment, the board level shield includes both a fence and a lid, where the fence is a perimeter of material affixed to the printed circuit board and surrounding the at least one heat-generating electrical device and heat sink, and where the lid includes a top and a lid sidewall, where the top is a plane of material having a shape complementary to the perimeter of the fence and the lid sidewall is a width of material perpendicular to and descending from the top, and where the lid is attached to the fence such that the lid sidewall substantially surrounds the fence.

In this embodiment, the assembly lid is attached to the fence via at least one latching mechanism, which may be, for example, a removable directional latching mechanism. In this embodiment, the assembly may further include at least one thermal interface material, where the thermal interface material resides between and is in thermal contact with the heat sink and the heat-generating electrical component. This embodiment may also include, on the lid sidewall, a plurality of tabs, where the tabs are material inwardly bent or inwardly bending towards the concave portion of the lid, the tabs being substantially perpendicular to the lid sidewall. Further, this embodiment may also include on the fence, a sidewall and a rail, where the rail is a perimeter of material substantially parallel to the top of the heat sink, meeting the fence sidewall at a bend, where the rail proceeds from the fence sidewall towards the heat sink, and where, when the lid is attached to the fence, the tabs rest on the rail.

In an exemplary embodiment, the lid sidewall includes a flared rim, wherein the bottom portion of the lid sidewall is at least partially bent away from the concave region of the lid along at least a portion of the bottom of the lid sidewall.

In this exemplary embodiment, the assembly may further include at least one thermal interface material, where the thermal interface material resides between and is in thermal contact with the heat sink and the heat-generating electrical component.

In another exemplary embodiment, the shielding assembly includes a board level shield and a heat sink, where the heat sink includes at least one pin (broadly, protrusion or protruding portion), and where the board level shield includes at least one perforation (broadly, opening). In this embodiment, the perforation and pin are complementary in shape such that the pin at least partially protrudes through the perforation when the board level shield mates with the heat sink to at least partially cover the heat sink. In this embodiment, the board level shield may optionally further include at least one press fit perforation.

Example embodiments disclosed herein may be used with a wide range of heat sources, electronic devices, and/or other heat removal/dissipation structures or components besides heat sinks (e.g., a heat spreader, etc.). For example, a heat sink may additionally or alternatively be made from a material (e.g., graphite, etc.) such that the heat sink has heat spreading characteristics. Also for example, a heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). Generally, a heat source may comprise any component or device that has a higher temperature or otherwise provides or transfers heat whether the heat is generated by the heat source or merely transferred through or via the heat source. Accordingly, aspects of the present disclosure should not be limited to any particular use with any single type of heat source, electronic device, heat removal/dissipation structure, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "includes," "including," "have," "has," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed:

1. A shielding assembly comprising:
a heat sink including a top, a bottom, and sides;
a board level shield including a fence and a lid, the fence including a perimeter of material around the sides of the heat sink, and the lid including a piece of material having a shape complementary to the perimeter of the fence, the lid being attachable to the fence to substantially enclose the top of the heat sink;
wherein:
the lid includes at least one perforation;
the heat sink includes a thermally conductive material having at least one pin on the top of the heat sink, where the at least one pin is a protrusion of the thermally conductive material from the heat sink; and
the at least one pin and the at least one perforation are complementary in shape such that when the lid is attached to the fence, the at least one pin at least partially protrudes through the at least one perforation;
wherein:
the lid comprises a top and a lid sidewall depending from and/or generally perpendicular to the top of the lid;
the lid sidewall substantially surrounds the fence when the lid is attached to the fence;
the fence comprises a fence sidewall and a rail;
the fence sidewall is generally perpendicular to the top of the heat sink;
the rail is generally parallel to the top of the heat sink; and
the rail meets the fence sidewall at a bend and proceeds from the fence sidewall towards the heat sink;
the lid sidewall further comprises a plurality of tabs that bend inward towards a concave portion of the lid and generally perpendicular to the lid sidewall; and
when the lid is attached to the fence, the plurality of tabs rests on the rail.

2. The shielding assembly of claim 1, wherein:
the at least one pin comprises a plurality of pins that are protrusions of the thermally conductive material from the heat sink;
the at least one perforation comprises a plurality of perforations in the lid; and
the plurality of pins and the plurality of perforations are arranged in a complementary manner such that when the lid is attached to the fence, each of the plurality of pins protrudes through a corresponding one of the plurality of perforations.

3. The shielding assembly of claim 2, wherein the assembly further comprises at least one latching mechanism to securably attach the lid to the fence.

4. The shielding assembly of claim 3, wherein the at least one latching mechanism is a removable directional latching mechanism.

5. The shielding assembly of claim 1, wherein:
the shielding assembly further comprises one or more thermal interface materials along the bottom of the heat sink; and/or
the lid further comprises at least one press fit perforation.

6. An assembly comprising a board level shield, a heat sink including at least one protrusion, and a printed circuit board including at least one heat source in thermal contact with the heat sink, wherein the board level shield comprises:
- a fence affixed to the printed circuit board and surrounding the at least one heat source and the heat sink; and
- a lid including a top having a shape complementary to a perimeter of the fence, a lid sidewall depending from and/or generally perpendicular to the top of the lid, and at least one opening configured for receiving at least a portion of the at least one protrusion of the heat sink;
- wherein the lid is attachable to the fence such that the lid sidewall substantially surrounds the fence and such that the at least one protrusion of the heat sink at least partially protrudes through the at least one opening of the lid;
- wherein:
  - the lid sidewall further comprises a plurality of tabs generally perpendicular to the lid sidewall; and
  - the plurality of tabs comprise material bent inwardly towards a concave portion of the lid.

7. The assembly of claim 6, wherein:
- the at least one protrusion comprises a plurality of protrusions of a thermally conductive material from the heat sink;
- the at least one opening comprises a plurality of openings in the top of the lid; and
- the plurality of protrusions and the plurality of openings are arranged in a complementary manner such that when the lid is attached to the fence, each of the plurality of protrusions protrudes through a corresponding one of the plurality of openings.

8. The assembly of claim 6, wherein the lid is removably attachable to the fence via at least one latching mechanism.

9. The assembly of claim 8, wherein the at least one latching mechanism is a removable directional latching mechanism.

10. The assembly of claim 6, further comprising one or more thermal interface materials between and in thermal contact with the heat sink and the heat source.

11. The assembly of claim 6, wherein:
- the fence comprises a fence sidewall and a rail generally parallel to a top of the heat sink;
- the rail meets the fence sidewall at a bend and proceeds from the fence sidewall towards the heat sink; and
- when the lid is attached to the fence, the plurality of tabs rests on the rail.

12. The assembly of claim 6, wherein:
- the lid sidewall comprises a flared rim; and
- a bottom portion of the lid sidewall is at least partially bent away from a concave region of the lid along at least a portion of a bottom of the lid sidewall.

13. The assembly of claim 6, wherein the lid further comprises at least one press fit perforation.

14. A assembly comprising a board level shield, a heat sink including at least one protrusion, and a printed circuit board including at least one heat source in thermal contact with the heat sink, wherein the board level shield comprises:
- a fence affixed to the printed circuit board and surrounding the at least one heat source and the heat sink; and
- a lid including a top having a shape complementary to a perimeter of the fence, a lid sidewall depending from and/or generally perpendicular to the top of the lid, and at least one opening configured for receiving at least a portion of the at least one protrusion of the heat sink;
- wherein the lid is attachable to the fence such that the lid sidewall substantially surrounds the fence and such that the at least one protrusion of the heat sink at least partially protrudes through the at least one opening of the lid; and
- wherein the assembly further comprises one or more thermal interface materials between and in thermal contact with the heat sink and the at least one heat source, wherein:
- the lid sidewall further comprises a plurality of tabs that bend inward towards a concave portion of the lid and that are generally perpendicular to the lid sidewall;
- the fence comprises a sidewall and a rail generally parallel to a top of the heat sink;
- the rail meets the fence sidewall at a bend and proceeds from the fence sidewall towards the heat sink;
- when the lid is attached to the fence, the plurality of tabs rests on the rail; and
- the lid further comprises at least one press fit perforation.

15. The assembly of claim 14, wherein
the plurality of tabs comprise material bent inwardly towards the concave portion of the lid.

16. A shielding assembly comprising a board level shield including at least one opening and a heat sink including at least one protrusion, wherein the at least one opening and the one protrusion are complementary in shape such that the at least one protrusion at least partially protrudes through the at least one opening when the board level shield mates with the heat sink to at least partially cover the heat sink, wherein the board level shield comprises a lid including a lid sidewall, and wherein the lid sidewall comprises a plurality of tabs that bend inward towards a concave portion of the lid and generally perpendicular to the lid sidewall.

17. The shielding assembly of claim 16, wherein:
- the board level shield comprises a fence;
- the lid comprises a top and the lid sidewall depends from and/or is generally perpendicular to the top of the lid; and
- the lid sidewall substantially surrounds the fence when the lid is attached to the fence.

18. The shielding assembly of claim 17, wherein:
- the fence comprises a fence sidewall and a rail;
- the fence sidewall is generally perpendicular to the top of the heat sink;
- the rail is generally parallel to the top of the heat sink; and
- the rail meets the fence sidewall at a bend and proceeds from the fence sidewall towards the heat sink.

19. The shielding assembly of claim 18, wherein
when the lid is attached to the fence, the plurality of tabs rests on the rail.

20. The shielding assembly of claim 16, wherein:
- the board level shield comprises a fence and the lid is attachable to the fence;
- the at least one opening includes a plurality of openings in the lid;
- the heat sink includes a thermally conductive material;
- the at least one protrusion includes a plurality of protrusions that are portions of the thermally conductive material that protrude from the heat sink;
- the plurality of openings and the plurality of protrusions are complementary in shape and arranged in a complementary manner such that when the lid is attached to the fence, each of the plurality of protrusions protrudes through a corresponding one of the plurality of openings; and
- the board level shield further comprises at least one press fit perforation.

* * * * *